United States Patent
Lee et al.

(10) Patent No.: US 8,598,957 B2
(45) Date of Patent: Dec. 3, 2013

(54) OSCILLATORS AND METHODS OF MANUFACTURING AND OPERATING THE SAME

(75) Inventors: Sung-chul Lee, Osan-si (KR); Ung-hwan Pi, Seoul (KR); Kee-won Kim, Suwon-si (KR); Kwang-seok Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 98 days.

(21) Appl. No.: 13/208,061

(22) Filed: Aug. 11, 2011

(65) Prior Publication Data

US 2012/0126904 A1    May 24, 2012

(30) Foreign Application Priority Data

Nov. 24, 2010  (KR) .................. 10-2010-0117522

(51) Int. Cl.
  *H03B 1/00* (2006.01)
  *H01L 29/82* (2006.01)
  *B32B 7/02* (2006.01)
(52) U.S. Cl.
  USPC .......... 331/46; 331/96; 331/187; 360/324.11; 360/324.12
(58) Field of Classification Search
  USPC ........... 257/421; 331/3, 94.1, 96, 108 C, 154, 331/187, 46; 360/324.1, 324.11, 324.12, 360/324.2; 365/158, 171, 173
  See application file for complete search history.

(56) References Cited

U.S. PATENT DOCUMENTS

| | | | |
|---|---|---|---|
| 6,351,409 B1 * | 2/2002 | Rizzo et al. | 365/158 |
| 6,411,476 B1 * | 6/2002 | Lin et al. | 360/324.11 |
| 6,469,878 B1 * | 10/2002 | Mack et al. | 360/324.12 |
| 6,833,982 B2 | 12/2004 | Jayasekara | |
| 6,909,633 B2 * | 6/2005 | Tsang | 365/173 |
| 6,930,866 B2 | 8/2005 | Jayasekara | |
| 7,061,797 B1 * | 6/2006 | Miltat et al. | 365/171 |
| 7,390,584 B2 * | 6/2008 | Daughton et al. | 428/811.2 |

(Continued)

FOREIGN PATENT DOCUMENTS

KR    10-0463616 A    12/2004
KR    2009-0087825 A    8/2009

OTHER PUBLICATIONS

"Bias-driven high power microwave emission from MgO-based tunnel magnetoresistance devices", Oct. 2008, Deac et al., Nature Physics, vol. 4, pp. 803-809.

(Continued)

*Primary Examiner* — Levi Gannon
(74) *Attorney, Agent, or Firm* — Harness, Dickey & Pierce, P.L.C.

(57) ABSTRACT

Oscillators and methods of manufacturing and operating an oscillator are provided, the oscillators include a base free layer having a variable magnetization direction, and at least one oscillation unit on the base free layer. The oscillation unit may include a free layer element contacting the base free layer and having a width less than a width of the base free layer, a pinned layer element separated from the free layer element, and a separation layer element between the free layer element and the pinned layer element. A plurality of oscillation units may be arranged on the base free layer.

22 Claims, 11 Drawing Sheets

(56) References Cited

U.S. PATENT DOCUMENTS

| | | | |
|---|---|---|---|
| 8,018,011 B2* | 9/2011 | Ranjan et al. | 257/421 |
| 8,174,798 B2* | 5/2012 | Nagasawa et al. | 360/313 |
| 8,194,361 B2* | 6/2012 | Kudo et al. | 360/324.11 |
| 8,207,806 B2* | 6/2012 | Kudo et al. | 335/296 |
| 8,320,080 B1* | 11/2012 | Braganca et al. | 360/128 |
| 2007/0171570 A1 | 7/2007 | Gill | |
| 2009/0115541 A1* | 5/2009 | Persson et al. | 331/135 |
| 2010/0110783 A1* | 5/2010 | Liu et al. | 365/171 |

OTHER PUBLICATIONS

"Microwave oscillations of a nanomagnet driven by a spin-polarized current", Sep. 2003, Kiselev et al., Nature, vol. 425, pp. 380-383.

"Mutual phase-locking of microwave spin torque nano-oscillators", Sep. 2005, Kaka et al., Nature, vol. 437, pp. 389-392.

"Direct-Current Induced Dynamics in $Co_{90}Fe_{10}/Ni_{80}Fe_{20}$ Point Contacts", Jan. 2004, Rippard et al., Physical Review Letters, vol. 92, No. 2.

* cited by examiner

< SECOND COMPARATIVE EXAMPLE >

OSCILLATORS AND METHODS OF MANUFACTURING AND OPERATING THE SAME

CROSS-REFERENCE TO RELATED APPLICATIONS

This application claims the benefit of priority under 35 U.S.C. §119 from Korean Patent Application No. 10-2010-0117522, filed on Nov. 24, 2010, in the Korean Intellectual Property Office, the disclosure of which is incorporated herein by reference in its entirety.

BACKGROUND

1. Field

Example embodiments relates to oscillators and methods of manufacturing and operating an oscillator.

2. Description of the Related Art

Oscillators are devices that generate signals having a regular cycle and are mainly used in wireless communication systems (e.g., mobile communication terminals, satellite/radar communication devices, wireless network devices, or automobile communication devices), as well as, analog sound synthesizers. Mobile communication devices operate in particular frequency bands, and a voltage-controlled oscillator (VCO) is used to generate a particular frequency band.

Essential characteristics of an oscillator include a quality factor, output power, and phase noise. The higher the quality factor and output power and the lower the phase noise, the better the performance of the oscillator. Recently, because highly efficient and small communication devices are required and an operating frequency band has become high, small size and large output oscillators having high quality factor and lower phase noise are required.

A spin torque oscillator using a spin transfer torque has been recently introduced. The spin torque oscillator may be classified as a nanopillar structure or a point contact structure. The spin torque oscillator has drawn attention as a next generation oscillator because the spin torque oscillator may be manufactured to be much smaller than general inductor and capacitor (LC) oscillators and general film bulk acoustic resonator (FBAR) oscillators. The spin torque oscillator may have a relatively high quality factor. However, an output power of a general spin torque oscillator is low.

SUMMARY

Example embodiments relates to oscillators and methods of manufacturing and operating an oscillator.

Provided are oscillators that use a spin transfer torque and that have a high output power and low phase noise.

Provided are methods of manufacturing and operating the oscillators.

Additional aspects will be set forth in part in the description which follows and, in part, will be apparent from the description, or may be learned by practice of the presented embodiments.

According to example embodiments, an oscillator includes a base free layer having a variable magnetization direction, and at least one oscillation unit on the base free layer. The at least one oscillation unit includes a free layer element (directly) contacting the base free layer and having a width less than a width of the base free layer, a pinned layer element separated from the free layer element, and a separation layer element between the free layer element and the pinned layer element.

The pinned layer element has a fixed magnetization direction.

The separation layer element may include an insulating material.

The base free layer, the free layer element, and the pinned layer element may have an in-plane magnetic anisotropy.

The base free layer and the free layer element may have a perpendicular magnetic anisotropy, and the pinned layer element may have an in-plane magnetic anisotropy.

The free layer element may have a thickness equal to or greater than about 0.5 nm.

The oscillation unit may be arranged on a top (or upper) surface of the base free layer. Alternatively, the oscillation unit may be arranged on a bottom (or lower) surface of the base free layer.

A plurality of the oscillation units may be arranged on the base free layer.

The oscillator may further include a first current source (electrically) connected to a first region of the base free layer corresponding to a first oscillation unit of the plurality of the oscillation units, a second current source (electrically) connected to a second region of the base free layer corresponding to a second oscillation unit of the plurality of the oscillation units, a first capacitor connected between the first current source and the first region, a second capacitor connected between the second current source and the second region, a signal combiner to which the first capacitor and the second capacitor are commonly connected, and a spectrum analyzer connected to the signal combiner.

The oscillator may further include a current source commonly (electrically) connected to a plurality of regions of the base free layer, which correspond to the plurality of the oscillation units, respectively, a capacitor (electrically) connected to a wiring that connects the current source and the base free layer, and a spectrum analyzer connected to the capacitor.

The oscillator may be a magnetic field-free oscillator configured to operate without application of an external magnetic field thereto.

According to example embodiments, a method of operating the oscillator includes inducing precession of a magnetic moment of the free layer element of the oscillation unit, and detecting variation of a resistance of the oscillator due to the precession.

Inducing the precession may include applying a current between the oscillation unit and the base free layer. The current may be applied in a direction that causes electrons to flow from the pinned layer element to the free layer element.

According to example embodiments, a method of manufacturing an oscillator includes forming a free layer having a lower portion and an upper portion, forming a separation layer on the free layer, forming a pinned layer on the separation layer, and forming at least one oscillation unit on the lower portion of the free layer by patterning the pinned layer, the separation layer, and the upper portion of the free layer.

The separation layer may include an insulating material.

The free layer and the pinned layer may have an in-plane magnetic anisotropy.

The free layer may have a perpendicular magnetic anisotropy, and the pinned layer may have an in-plane magnetic anisotropy.

The upper portion of the free layer may have a thickness equal to or greater than about 0.5 nm.

According to example embodiments, a method of manufacturing an oscillator includes forming at least one oscillation unit having a pinned layer element, a separation layer element, and a free layer element that are sequentially stacked, and forming a base free layer on the at least one oscillation unit, wherein the base free layer has a width greater than a width of the at least one oscillation unit.

The separation layer may include an insulating material.

The base free layer, the free layer element, and the pinned layer element may have an in-plane magnetic anisotropy.

The base free layer and the free layer element may have a perpendicular magnetic anisotropy, and the pinned layer may have an in-plane magnetic anisotropy.

The free layer element may have a thickness equal to or greater than about 0.5 nm.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
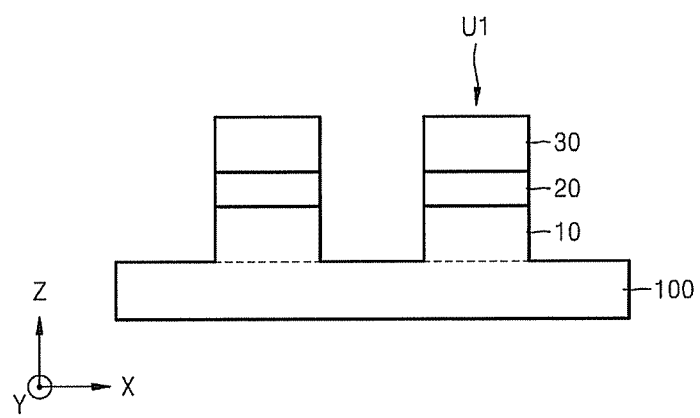
FIG. 1 is a cross-sectional view of an oscillator according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms; such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Example embodiments relates to oscillators and methods of manufacturing and operating an oscillator.

FIG. 1 is a cross-sectional view of an oscillator according to example embodiments.

Referring to FIG. 1, at least one oscillation unit U1 may be arranged on a base free layer 100. The oscillation unit U1 may include a free layer element 10, a separation layer element 20, and a pinned layer element 30 that are sequentially stacked on the base free layer 100. In other words, the oscillation unit U1 may include the free layer element 10 contacting the base free layer 100, the pinned layer element 30 separate from the free layer element 10, and the separation layer element 20 between the free layer element 10 and the pinned layer element 30. Viewing the oscillator from above, the oscillation unit U1 may be a dot type having a particular shape (e.g., a rectangular shape or a circular shape). A width of the free layer element 10 may be less than a width of the base free layer 100. A width of each of the separation layer element 20 and the pinned layer element 30 may also be less than the width of the base free layer 100. Hereinafter, the aforementioned elements are described in detail.

The base free layer 100 and the free layer element 10 may be similar to each other in that they have a variable magnetization direction. The base free layer 100 and the free layer element 10 may be formed of a general ferromagnetic material. The ferromagnetic material may include at least one of cobalt (Co), iron (Fe), nickel (Ni) and combinations thereof, and may further include at least one other element (e.g., boron (B), chromium (Cr), platinum (Pt), palladium (Pd), or the like). For example, the base free layer 100 and the free layer element 10 may include at least one of CoFeB, CoFe, NiFe, CoFePt, CoFePd, CoFeCr, CoFeTb, CoFeGd or CoFeNi. The base free layer 100 and the free layer element 10 may be formed of the same, or similar, material(s) but are not limited thereto.

The base free layer 100 and the free layer element 10 may form one body. Thus, the free layer element 10 may indicate a portion projecting (or protruding) from the base free layer 100. Also, the free layer element 10 may indicate an element that is equal to the base free layer 100 except for their sizes or their sizes and shapes. The free layer element 10 may have a thickness about at least 0.5 nm. For example, a thickness of the free layer element 10 may be from about 0.5 nm to about 15 nm. Also, a thickness of the base free layer 100 may be equal to, or less than, about several nanometers. The sum of the thicknesses of the base free layer 100 and the free layer element 10 may be from about 0.8 nm to about 40 nm, but a thickness range is not limited thereto.

A magnetization direction of the pinned layer element 30 is fixed in a set (or particular) direction, and the pinned layer element 30 may be formed of a ferromagnetic material including at least one of Co, Fe, Ni and combinations thereof. The ferromagnetic material may further include at least one other element (e.g., boron (B), chromium (Cr), platinum (Pt), palladium (Pd), terbium (Tb), gadolinium (Gd) and the like) in addition to Co, Fe, and Ni. The pinned layer element 30 may be formed of the same material as the base free layer 100 and the free layer element 10, or may be formed of a different material than the base free layer 100 and the free layer element 10. The magnetization direction of the pinned layer element 30 may be fixed by using one of various methods. For example, in order to fix the magnetization direction of the pinned layer element 30, a synthetic anti-ferromagnetic (SAF) structure (not shown) or an antiferromagnetic layer (not shown) may be used. Without using the SAF structure or the antiferromagnetic layer, the magnetization direction of the pinned layer element 30 may be fixed in a set (or particular) direction by increasing a thickness of the pinned layer element 30 or by using shape anisotropy. That is, without using an additional layer, the magnetization direction of the pinned layer element 30 may be fixed.

The separation layer element 20 may be formed of an insulating material. For example, any insulating barrier material used in a magnetic tunnel junction (MTJ) structure may be used to form the separation layer element 20. For example, the separation layer element 20 may include an insulating material (a dielectric material) such as a magnesium (Mg) oxide or an aluminum (Al) oxide. When an insulating material (e.g., Mg oxide) is used to form the separation layer element 20, a magnetoresistance ratio (MR) ratio of the oscillation unit U1 may be increased so that an output power may be increased. However, according to other example embodiments, instead of the insulating material, a conductive material may be used to form the separation layer element 20. That is, the conductive material may include at least one of copper (Cu), aluminum (Al), gold (Au), silver (Ag), and the like. The conductive material may include conductive materials generally used for a spacer in a giant magneto resistance (GMR) structure. A thickness of the separation layer element 20 may be equal to, or less than, about 10 nm, in particular, equal to, or less than, about 5 nm.

Although not illustrated in FIG. 1, the oscillator may further include a first electrode (directly or indirectly) contacting the base free layer 100, and a second electrode (directly or indirectly) contacting the pinned layer element 30. The first electrode may be formed on a bottom (or lower) surface of the base free layer 100 (e.g., on a surface opposite to the free layer element 10), and the second electrode may be formed on a top (or upper) surface of the pinned layer element 30 (e.g., on a surface opposite to the separation layer element 20). According to materials of the base free layer 100 and the pinned layer element 30, the formation of the first and second electrodes may be optional. For example, in a case where an electric resistance of the base free layer 100 and the pinned layer element 30 is sufficiently low, the base free layer 100 and the pinned layer element 30 may be used as electrodes. Thus, the first and second electrodes may not be necessary.

In the example embodiments of FIG. 1, the base free layer 100 and the free layer element 10 may have an in-plane magnetic anisotropy, or a perpendicular magnetic anisotropy, and the pinned layer element 30 may also have an in-plane magnetic anisotropy or a perpendicular magnetic anisotropy. In other words, the base free layer 100 and the free layer element 10 may have a magnetization easy axis that is parallel to an XY plane or a Z-axis, and the pinned layer element 30 may have a magnetization direction that is parallel to an XY plane or a Z-axis.

Figure 2:
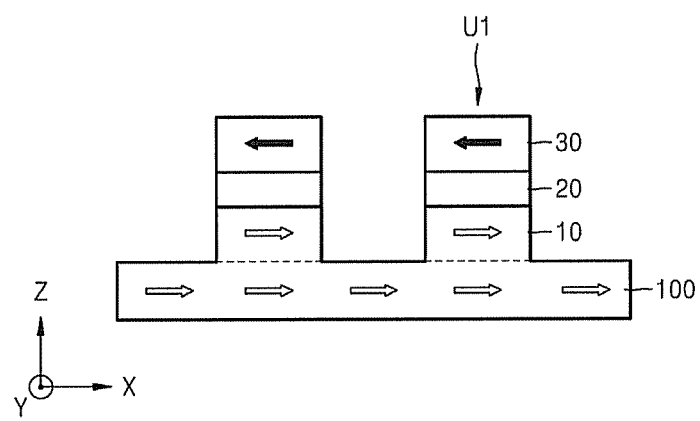
FIGS. 2 and 3 are cross-sectional views illustrating examples of a magnetization direction in a base free layer, a free layer element, and a pinned layer element of the oscillator in FIG. 1.
Figure 3:
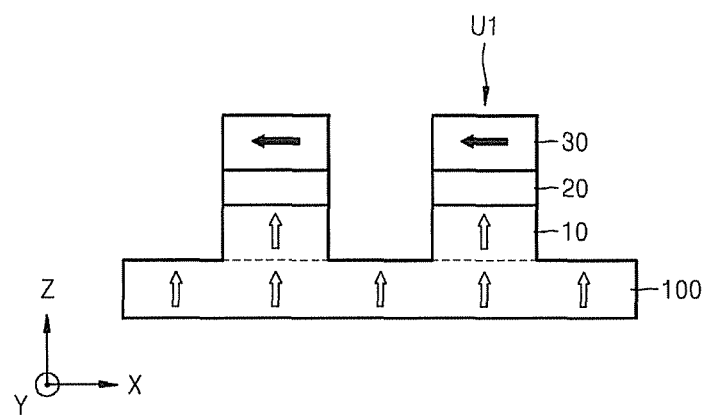

FIGS. 2 and 3 are cross-sectional views illustrating examples of a magnetization direction in the base free layer, the free layer element, and the pinned layer element of the oscillator in FIG. 1.

Referring to FIG. 2, the base free layer 100, the free layer element 10, and the pinned layer element 30 may have an in-plane magnetic anisotropy. For example, the base free layer 100, the free layer element 10 and the pinned layer element 30 may have a magnetization direction parallel to an X-axis. The arrow illustrated in the base free layer 100, the free layer element 10, and the pinned layer element 30 indicates the magnetization direction thereof, and this applies to other drawings of the other figures.

Referring to FIG. 3, the base free layer 100 and the free layer element 10 may have a perpendicular magnetic anisotropy, and the pinned layer element 30 may have an in-plane magnetic anisotropy. For example, the base free layer 100 and the free layer element 10 may have a magnetization direction parallel to a Z-axis, and the pinned layer element 30 may have a magnetization direction parallel to an X-axis.

Figure 4:
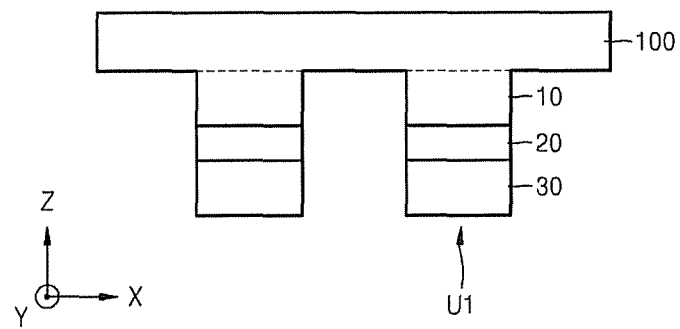
FIG. 4 is a cross-sectional view of an oscillator according to other example embodiments.

FIG. 4 is a cross-sectional view of an oscillator according to other example embodiments.

Referring to FIG. 4, at least one oscillation unit U1 may be arranged on a bottom (or lower) surface of a base free layer 100. In this case, because a pinned layer element 30 is arranged below the base free layer 100, the oscillator may have a bottom pinned layer structure. The oscillator of FIG. 4 may have an inverse structure of the oscillator of FIG. 1. A magnetization direction of the base free layer 100, the free layer element 10, and the pinned layer element 30 in FIG. 4 may be the same as that in FIGS. 2 and 3.

Figure 5:
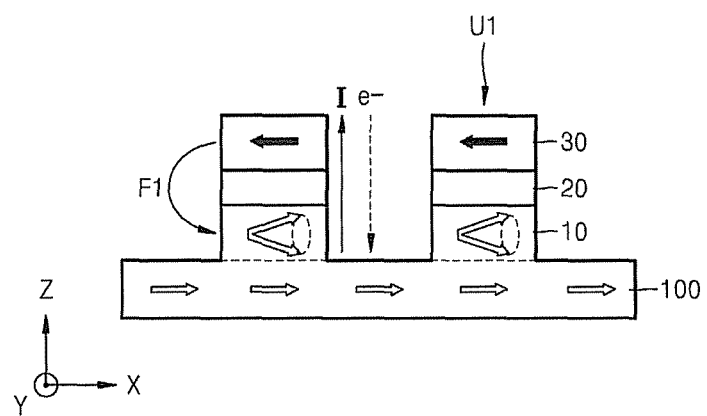
FIGS. 5 and 6 are cross-sectional views for describing a method of operating an oscillator according to example embodiments.

FIG. 5 is a cross-sectional view for describing a method of operating an oscillator according to example embodiments. The oscillator of FIG. 5 has a structure shown in FIG. 2.

Referring to FIG. 5, precession of a magnetic moment of a free layer element 10 may be induced by applying a current I to the oscillator. The current I may be applied from a base free layer 100 to a pinned layer element 30. Due to the current I, electrons e- may flow from the pinned layer element 30 to the base free layer 100 via the free layer element 10. The electrons e- that flow from the pinned layer element 30 to the free layer element 10 may have the same spin direction as the pinned layer element 30 and may apply a spin torque to the free layer element 10. Due to this spin torque, the magnetic moment of the free layer element 10 may be perturbed. Also, a stray field F1 may be applied from the pinned layer element 30 to the free layer element 10. Due to this stray field F1, a restoring force may be applied to the magnetic moment of the free layer element 10. Thus, the perturbing force of the magnetic moment of the free layer element 10 due to the spin torque and the restoring force of the magnetic moment due to the, stray field F1 may be balanced so that the magnetic moment may be precessed. The precession of the magnetic moment means that an axis of the magnetic moment rotates in a particular orbit. The axis direction of the magnetic moment may be the same as the magnetization direction. Thus, the precession of the magnetic moment may correspond to a rotation of the magnetization direction. Due to the precession of the magnetic moment, an electric resistance of the oscillation unit U1 may periodically vary, and as a result, a signal in a particular frequency band may oscillate. The mechanism of the precession described above is exemplary, and thus other principles other than this mechanism may be applied thereto. Also, a trace of the precession in FIG. 5 is only an example, and thus the trace and direction of the precession may be varied according to the intensity of current I, for example.

By the application of the current I thereto, a spin wave may be generated (induced) in the base free layer 100. In other words, a magnetic moment of the base free layer 100 may be waved by the current I. The spin wave of the base free layer 100 may function to synchronize signals generated from a plurality of oscillation units U1.

In a case where a plurality of oscillation units U1 are arranged, magnetic moments of a plurality of free layer elements 10 may be simultaneously precessed. Because the signals generated from the plurality of oscillation units U1 may be synchronized, a high output power may be obtained. The greater the number of the oscillation units U1 is, the higher the output power is. In particular, in a case where a separation layer element 20 used in the oscillation unit U1 is an insulating layer (e.g., Mg oxide layer), an MR ratio of the oscillation unit U1 may be increased so that the output power may be further increased. Also, when the signals generated from the plurality of oscillation units U1 are synchronized, phase noise may be decreased accordingly. For example, when the number of the oscillation units U1 is two and signals generated from the two oscillation units U1 are synchronized, phase noise may be decreased by half, compared to a case in which only one oscillation unit U1 is used. If the phase noise is decreased, a quality factor may be increased. Thus, according to example embodiments, it is possible to embody a spin torque oscillator having a higher output power, a higher quality factor, and lower phase noise.

In addition, according to example embodiment described with reference to FIG. 5, the restoring force may be applied to the free layer element 10 by using the stray field F1 generated from the pinned layer element 30, so that a separate external magnetic field may not be required. That is, the oscillator according to example embodiments may be a magnetic field-free oscillator capable of oscillating a high frequency signal without application of an external magnetic field thereto. This oscillator does not demand a device for the application of the external magnetic field thereto, so that the oscillator may have a compact structure and may be operated in a simple manner. However, according to other example embodiments, an external magnetic field may be further applied to the oscillator. In this case, the external magnetic field may be horizontally, or vertically, applied to the oscillator.

Also, the oscillator according to example embodiments may be a frequency tunable oscillator of which an oscillating frequency may vary according to a condition of an operating current (the current I of FIG. 5), and materials and thicknesses of elements configuring the oscillator. The oscillator according to example embodiments may operate by using only a current and not an external magnetic field, so that frequency adjustment in the oscillator may be easier to compare to a case in which an external magnetic field is used.

Figure 6:
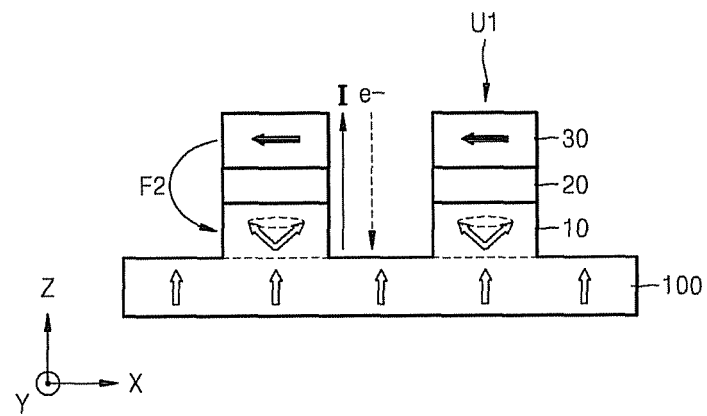

FIG. 6 is a cross-sectional view for describing a method of operating an oscillator, according to example embodiments. The oscillator of FIG. 6 has a structure shown in FIG. 3.

Referring to FIG. 6, although a base free layer 100 and a free layer element 10 have a perpendicular magnetic anisotropy, and a pinned layer element 30 has an in-plane magnetic anisotropy, it is possible to induce precession of a magnetic moment of the free layer element 10 by using a similar method to that of FIG. 5. The precession of the magnetic moment of the free layer element 10 may be induced due to a spin torque by electrons e- flowing from the pinned layer element 30 to the free layer element 10, and a stray field F2 applied from the pinned layer element 30 to the free layer element 10. A trace of the precession in FIG. 6 is exemplary, and thus the trace and direction of the precession may be varied according to the intensity of current I, for example.

Figure 7:
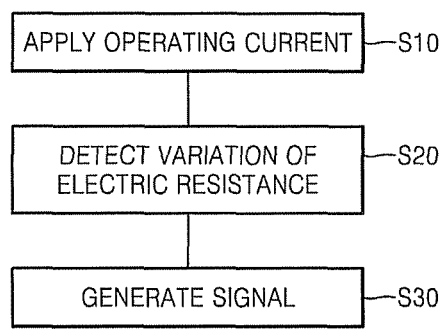
FIG. 7 is a flowchart of a method of operating an oscillator, according to example embodiments.

FIG. 7 is a flowchart of a method of operating an oscillator, according to example embodiments. FIG. 7 is described with reference to FIGS. 5 and 6.

Referring to FIG. 7, a current may be applied to the oscillator so as to induce precession of a magnetic moment of the free layer element 10 (S10). During the precession of the magnetic moment of the free layer element 10, variation of an electric resistance of the oscillation unit U1 may be detected (S20). Due to the precession, the electric resistance of the oscillation unit U1 may periodically vary. Referring to FIGS. 5 and 6, the variation of the electric resistance of the oscillation unit U1 may correspond to variation of an electric resistance between the pinned layer element 30 and a region of the base free layer 100 corresponding to the pinned layer element 30. Due to the variation of the electric resistance of the oscillation unit U1, a signal having a set (or particular) frequency may be generated (S30).

Figure 8:
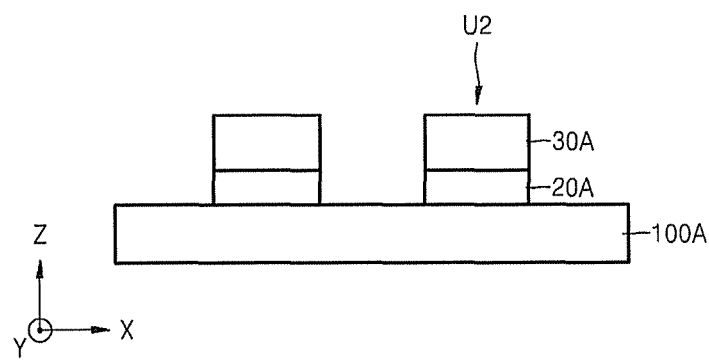
FIGS. 8 and 9 are cross-sectional views of an oscillator according to comparative examples.

FIG. 8 is a cross-sectional view of an oscillator according to a first comparative example.

Referring to FIG. 8, the oscillator according to the first comparative example includes a plurality of stack units U2 patterned on a magnetic layer 100A, and each of the patterned stack units U2 includes a separation layer element 20A and a pinned layer element 30A that are sequentially stacked. That is, a structure of FIG. 8 is similar to a structure of FIG. 1 but does not include the free layer element 10 of FIG. 1. In the structure of FIG. 8, a stray field generated in the pinned layer element 30A is broadly applied to a large area of the magnetic layer 100A, so that intensity of the stray field that is applied to a region of the magnetic layer 100A corresponding to the pinned layer element 30A may be low. Thus, it may be difficult to induce precession of a magnetic moment of the magnetic layer 100A corresponding to the pinned layer element 30A. On the other hand, in the oscillator according to example embodiments described in FIG. 5, the stray field F1 of the pinned layer element 30 may be intensively applied to the free layer element 10, so that the precession of the magnetic moment of the free layer element 10 may be easily induced. In this regard, it may be necessary for the free layer element 10 to have a certain thickness. For example, the thickness of the free layer element 10 may be equal to, or greater than, about 0.5 nm.

Figure 9:
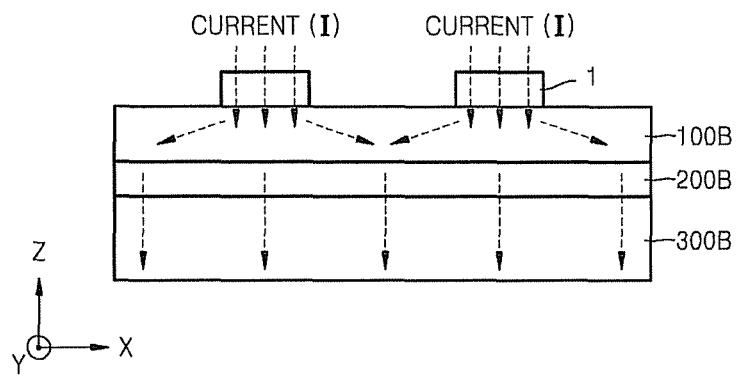

FIG. 9 is a cross-sectional view of an oscillator according to a second comparative example.

Referring to FIG. 9, the oscillator according to the second comparative example may have a structure in which an insulating barrier layer 200B and a free layer 100B are sequentially arranged on a pinned layer 300B. A plurality of electrodes 1 are arranged on the free layer 100B. The structure of FIG. 9 is similar to a point contact structure according to the related art but is different in the use of the insulating barrier layer 200B. That is, a spacer layer formed of a conductive material is used in the point contact structure according to the related art, but in the structure of FIG. 9, the insulating barrier layer 200B is used instead of the spacer layer.

In the structure of FIG. 9, when a current I is applied from an electrode 1 to the pinned layer 300B, the current I is rapidly propagated in the free layer 100B such that a current density may be sharply decreased. For this reason, it may not be possible to induce precession of a magnetic moment of the free layer 100B in the structure of FIG. 9. This is also a reason why an insulating barrier layer cannot be applied to an oscillator having the point contact structure according to the related art. On the other hand, in the oscillator according to the example embodiments of FIG. 1, the separation layer element 20 is patterned and the free layer element 10 therebelow is also patterned, so that current propagation (current spreading) does not occur, and a current density may be constant in the pinned layer element 30, the separation layer element 20, the free layer element 10, and the base free layer 100. Thus, the precession of the free layer element 10 may be easily induced, and the oscillator may have excellent operating characteristics.

Figure 10:
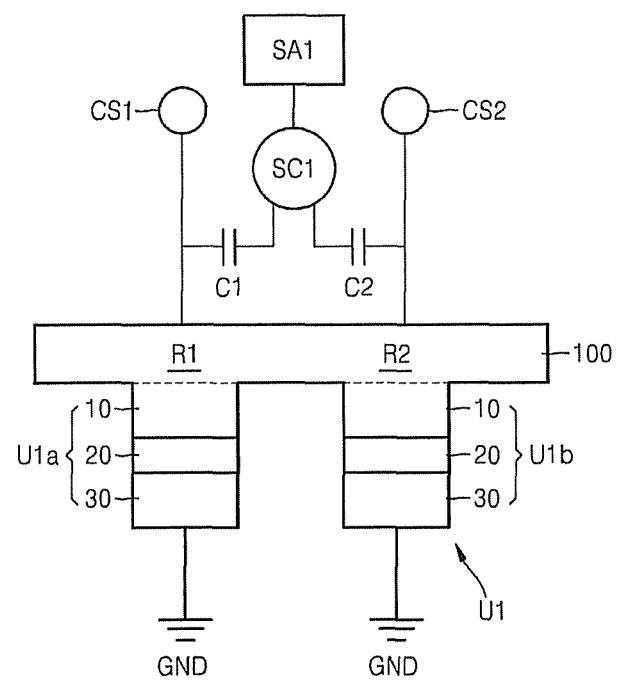
FIGS. 10 and 11 are diagrams of circuit configurations of an oscillator according to example embodiments.

FIG. 10 is a diagram of an exemplary circuit configuration of an oscillator according to example embodiments. The circuit configuration relates to the oscillator of FIG. 4 but may be applied to the oscillator of FIG. 1.

Referring to FIG. 10, a first current source CS1 may be connected to a first region R1 of a base free layer 100 of an oscillation unit (hereinafter, referred to as 'first oscillation unit U1a') from among a plurality of oscillation units U1. A second current source CS2 may be connected to a second region R2 of the base free layer 100 corresponding to another oscillation unit (hereinafter, referred to as 'second oscillation unit U1b') from among the plurality of oscillation units U1. A first capacitor C1 may be connected between the first current source CS1 and the first region R1 of the base free layer 100. A second capacitor C2 may be connected between the second current source CS2 and the second region R2 of the base free layer 100. The oscillator may include a signal combiner SC1 to which the first capacitor C1 and the second capacitor C2 are commonly connected. The oscillator may also include a spectrum analyzer SA1 connected to the signal combiner SC1. A pinned layer element 30 of each of the plurality of oscillation units U1 may be grounded.

A set (or threshold) current may be applied from the first current source CS1 to the first oscillation unit U1a. Due to the current, a resistance of the first oscillation unit U1a may periodically vary, and a radio frequency (RF) signal due to the periodical variation of the resistance may be input to the signal combiner SC1 via the first capacitor C1. Similarly, a resistance of the second oscillation unit U1b may periodically vary due to a current applied from the second current source CS2 to the second oscillation unit U1b, and a RF signal due to the periodical variation of the resistance may be input to the signal combiner SC1 via the second capacitor C2. The RF signals of the first oscillation unit U1a and the second oscillation unit U1b may be combined by the signal combiner SC1 and may be input to the spectrum analyzer SA1.

In the circuit configuration of FIG. 10, the first current source CS1 and the second current source CS2 are connected to the plurality of oscillation units U1, respectively, so that a current input to each of the plurality of oscillation units U1 may be separately adjusted. Because the current input to each of the plurality of oscillation units U1 may be minutely adjusted, respective signals generated from the respective plurality of oscillation units U1 may be easily adjusted.

Figure 11:
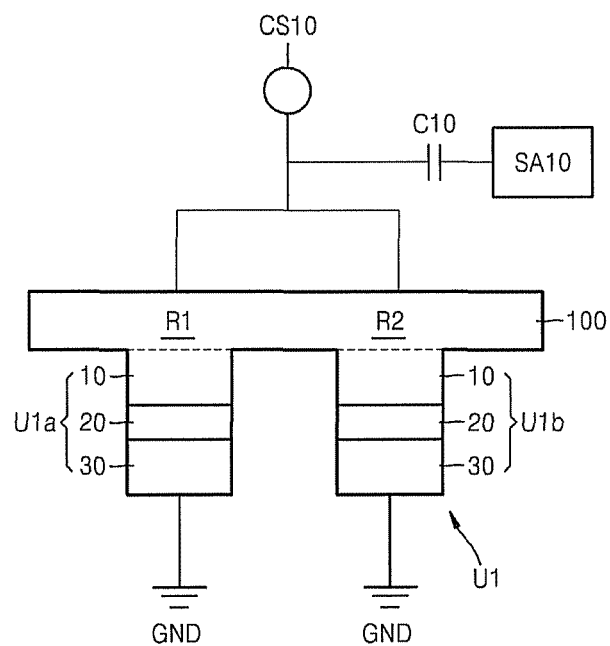

FIG. 11 is a diagram of an exemplary circuit configuration of an oscillator according to other example embodiments. The circuit configuration relates to the oscillator of FIG. 4 but may be applied to the oscillator of FIG. 1.

Referring to FIG. 11, a current source CS10 may be commonly connected to a plurality of regions R1 and R2 of a base free layer 100, which correspond to a plurality of oscillation units U1, respectively. A capacitor C10 may be connected to a wiring that connects the current source CS10 and the base free layer 100. Also, a spectrum analyzer SA10 may be connected to the capacitor C10. A pinned layer element 30 of each of the plurality of oscillation units U1 may be grounded.

In the circuit configuration of FIG. 11, a current may be commonly applied to the plurality of oscillation units U1 by using one current source CS10, so that the circuit configuration of the oscillator, and a method of operating the oscillator may be simplified.

By conversely using a principle of the oscillator, it is possible to embody an RF detector for converting a high frequency signal to a direct current (DC) signal. That is, structures shown in FIGS. 1 through 4 may be applied to an RF detector instead of an oscillator. Because those skilled in the art know that an RF detector may be embodied by conversely applying the principles of the oscillator, a detailed description of the RF detector will be omitted.

Figure 12A:
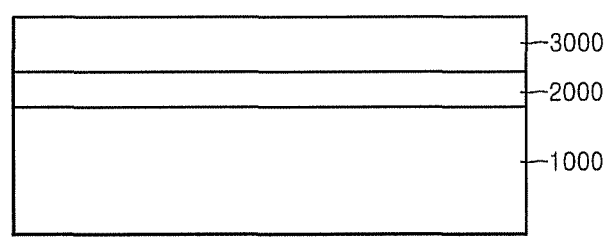
FIGS. 12A and 12B are cross-sectional views for describing a method of manufacturing an oscillator, according to example embodiments.
Figure 12B:
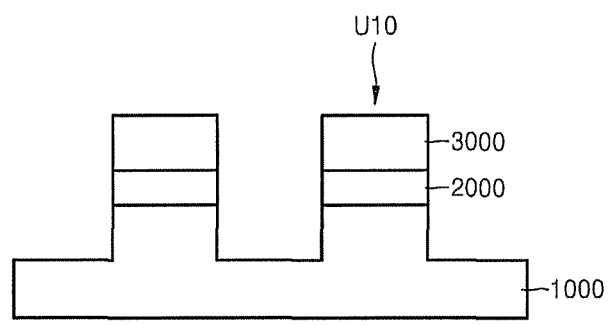

FIGS. 12A and 12B are cross-sectional views for describing a method of manufacturing an oscillator, according to example embodiments. The method shown in FIGS. 12A and 12B may be used to manufacture the oscillator having a structure as shown in FIG. 1.

Referring to FIG. 12A, a free layer 1000, a separation layer 2000, and a pinned layer 3000 may be sequentially stacked on a substrate (not shown). A material of the free layer 1000 may be the same as that of the base free layer 100 described above with reference to FIG. 1, and a thickness of the free layer 1000 may be the same as the sum of a thickness of the base free layer 100 and a thickness of the free layer element 10 of FIG. 1. Materials and thicknesses of the separation layer 2000 and the pinned layer 3000 may be respectively the same as those of the separation layer element 20 and the pinned layer element 30 described above with reference to FIG. 1.

Referring to FIG. 12B, the pinned layer 3000, the separation layer 2000, and an upper portion of the free layer 1000 may be patterned. As a result thereof, at least one oscillation unit U10 may be formed on a lower portion of the free layer 1000 which is not etched (i.e., not patterned). The oscillation unit U10 may include the patterned upper portion of the free layer 1000, the patterned separation layer 2000, and the patterned pinned layer 3000.

In this manner, the structure of FIG. 1 may be manufactured. However, the method may be an example and may be modified in various ways. For example, after a first free layer is formed, a second free layer, a separation layer, and a pinned layer may be formed thereon, and then the pinned layer, the separation layer, and the second free layer may be sequentially etched, so that an oscillation unit may be formed on the first free layer (i.e., base free layer). In this case, the first free layer and the second free layer may be formed of different materials. In addition to this method, the method of manufacturing the structure of FIG. 1 may be changed in other ways.

FIGS. 13A through 13D are cross-sectional views for describing a method of manufacturing an oscillator, according to example embodiments. The method according to example embodiments may be used to manufacture the oscillator having a structure shown in FIG. 4.

Figure 13A:
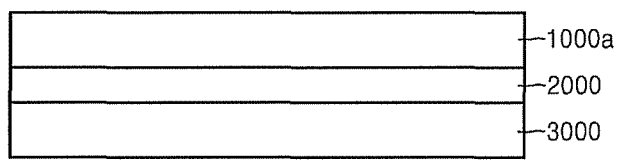
FIGS. 13A through 13D are cross-sectional views for describing a method of manufacturing an oscillator, according to other example embodiments.

Referring to FIG. 13A, a pinned layer 3000, a separation layer 2000, and a first free layer 1000a may be sequentially stacked on a substrate (not shown).

Figure 13B:
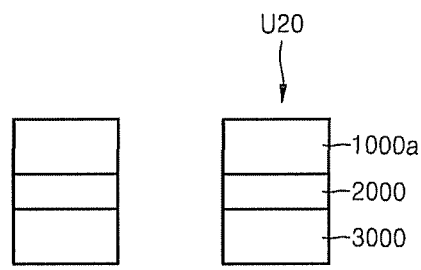

Referring to FIG. 13B, at least one oscillation unit U20 may be formed by patterning the first free layer 1000a, the separation layer 2000, and the pinned layer 3000.

Figure 13C:
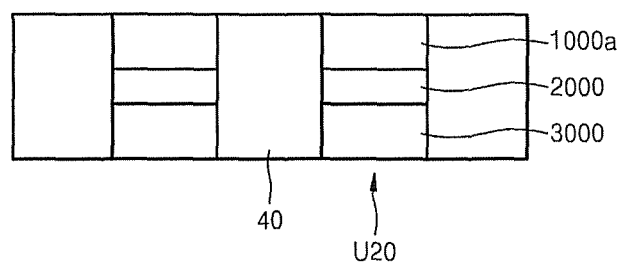

Referring to FIG. 13C, an insulating layer 40 may be formed between and around the oscillation units U20.

Figure 13D:
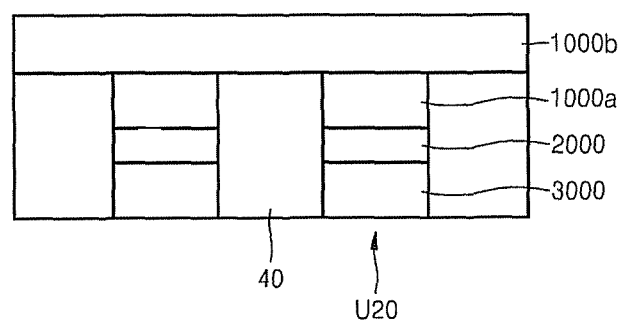

Referring to FIG. 13D, a second free layer 1000b may be formed on the oscillation units U20 and the insulating layer 40 so as to contact the oscillation units U20. In this manner, the structure shown in FIG. 4 may be manufactured. However, the method shown in FIGS. 13A-13D is exemplary and thus the method may be modified in various ways.

Figure 14:
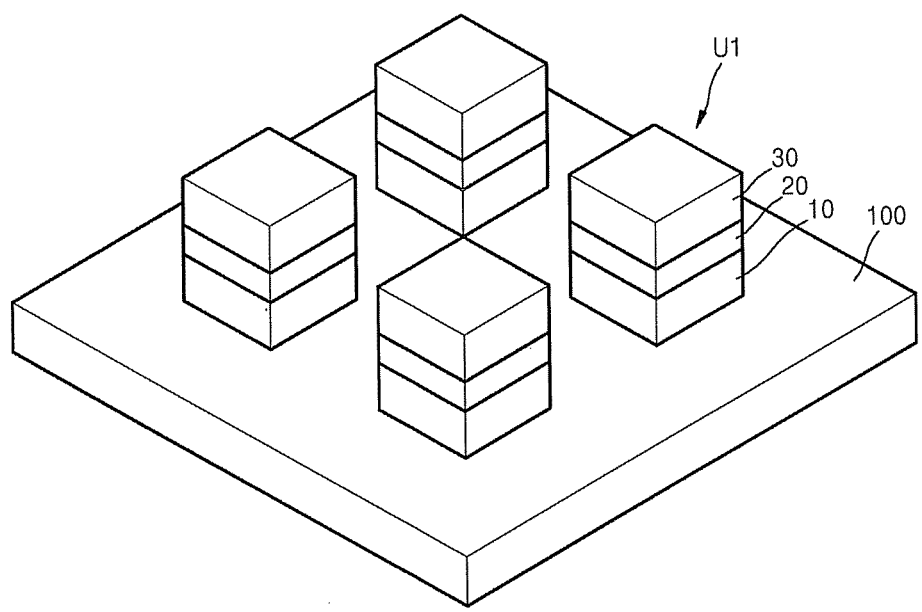
FIG. 14 is a perspective view of an oscillator according to example embodiments.

FIG. 14 is a perspective view illustrating an overview of a structure of the oscillator in FIGS. 1 and 12B.

A structure obtained by turning over the structure of FIG. 14 (i.e., an inverse structure) may correspond to a structure of FIGS. 4 and 13D. However, the structure of FIG. 14 is exemplary and thus may vary. For example, the oscillation unit U1 may have a cylindrical shape instead of a rectangular shape or other various shapes, and an array of the oscillation units U1 may be changed.

Figure 15:
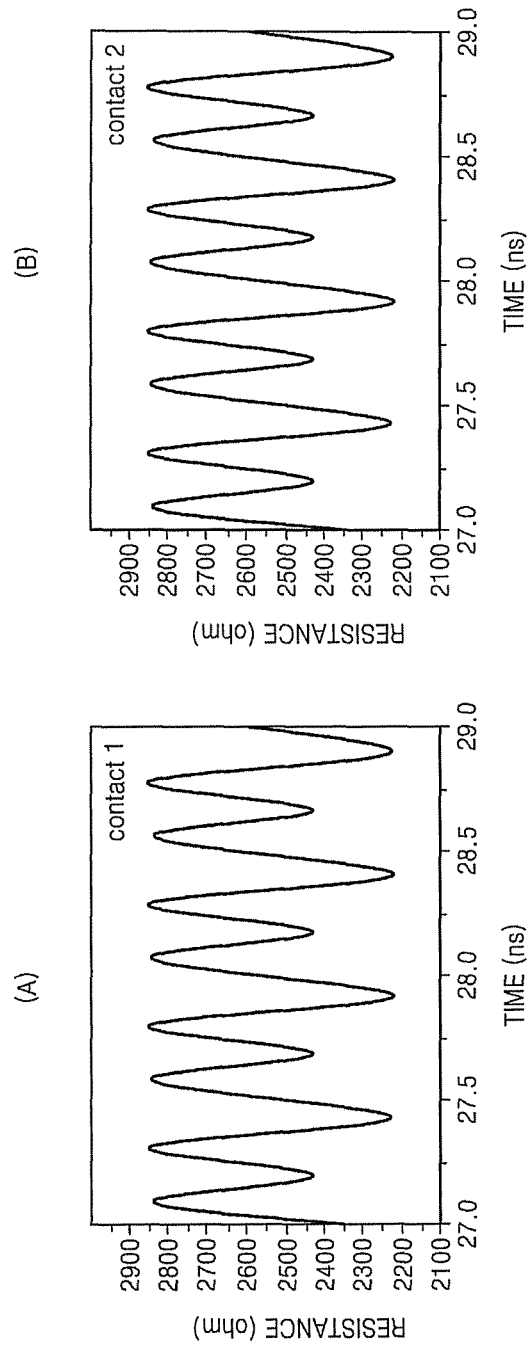
FIGS. 15 and 16 illustrate graphs showing resistance variations of oscillation units versus time, when a current is applied to an oscillator having a structure of FIG. 11.
Figure 16:
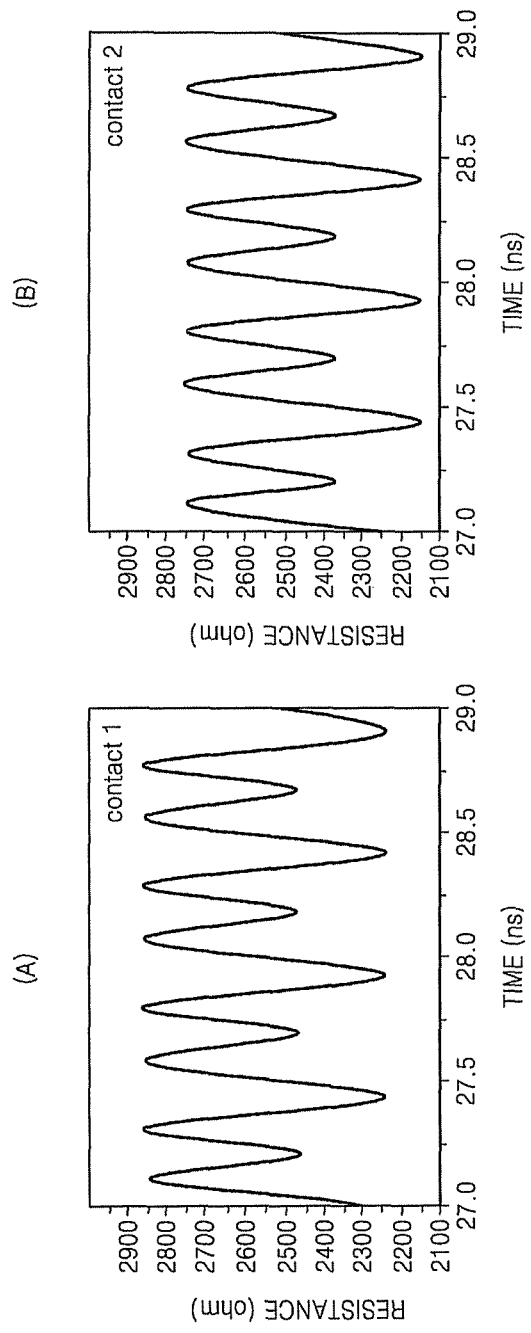

FIGS. 15 and 16 illustrate graphs showing resistance variations of oscillation units versus time, when a current is applied to an oscillator having a structure of FIG. 11.

FIG. 15 illustrates graphs (A) and (B) that respectively show resistance variations of first and second oscillation units U1$a$ and U1$b$ versus time, when a current is applied to an oscillator having a structure of FIG. 11. The graph (A) of FIG. 15 indicates the resistance variation of the first oscillation unit U1$a$, and the graph (B) of FIG. 15 indicates the resistance variation of the second oscillation unit U1$b$. The first and second oscillation units U1$a$ and U1$b$ of FIG. 15 have a diameter of about 80 nm. Here, a gap between the first and second oscillation units U1$a$ and U1$b$ is about 200 nm.

Referring to FIG. 15, the graphs (A) and (B) are substantially the same, which means that a resistance variation characteristic of the first oscillation unit U1$a$ is substantially the same as a resistance variation characteristic of the second oscillation unit U1$b$. Thus, a signal due to the resistance variation of the first oscillation unit U1$a$, and a signal due to the resistance variation of the second oscillation unit U1$b$ may be synchronized.

FIG. 16 illustrates graphs (A) and (B) that respectively show resistance variations of first and second oscillation units U1$a$ and U1$b$ versus time, when a current is applied to an oscillator having a structure of FIG. 11. FIG. 16 corresponds to a case in which the first oscillation unit U1$a$ has a diameter of about 80 nm, and the second oscillation unit U1$b$ has a diameter of about 85 nm. That is, the graphs (A) and (B) of FIG. 16 show results of the case in which sizes of the first and second oscillation units U1$a$ and U1$b$ are different from each other. Here, a gap between the first and second oscillation units U1$a$ and U1$b$ is about 200 nm. The graph (A) of FIG. 16 indicates the resistance variation of the first oscillation unit U1$a$, and the graph (B) of FIG. 16 indicates the resistance variation of the second oscillation unit U1$b$.

Referring to FIG. 16, although highs and lows of the graph (A) are somewhat different from those of the graph (B), waveforms of the graphs (A) and (B) are substantially the same except for the high and low difference. In a case where waveforms of graphs are substantially the same in spite of a high and low difference, signals corresponding to the graphs may be synchronized, which means that the signals of the first and second oscillation units U1$a$ and U1$b$ may be synchronized although the sizes of the first and second oscillation units U1$a$ and U1$b$ are different from each other. Thus, although the first and second oscillation units U1$a$ and U1$b$ have different sizes due to a problem in the manufacturing process (process variation), signal synchronization may not be affected thereby.

In addition, a gap between the first and second oscillation units U1$a$ and U1$b$ may be equal to or less than about 500 nm (e.g., equal to or less than about 250 nm). In a case where the gap between the first and second oscillation units U1$a$ and U1$b$ is too great, signal synchronization may be difficult. In other words, in order to achieve the signal synchronization, the gap between the first and second oscillation units U1$a$ and U1$b$ may be set to be equal to, or less than, about 500 nm (e.g., equal to or less than about 250 nm). However, a range (equal to or less than about 500 nm) of the gap is exemplary and thus an appropriate range of the gap may vary according to structures/materials of the first and second oscillation units U1$a$ and U1$b$. Also, in a case where the signal synchronization is not used, the gap between the first and second oscillation units U1$a$ and U1$b$ may be greater than about 500 nm.

It should be understood that the exemplary embodiments described therein should be considered in a descriptive sense only and not for purposes of limitation. For example, it is obvious to one of ordinary skill in the art that the structures and operating methods of FIGS. 1 through 7 may vary. For example, it is obvious to one of ordinary skill in the art that another material layer may be additionally arranged between layers configuring an oscillator or may be additionally arranged on at least one of top and bottom surfaces of an oscillator. Also, it is obvious to one of ordinary skill in the art that the manufacturing method described with reference to FIGS. 12A and 12B, and the manufacturing method described with reference to FIGS. 13A through 13D may vary. Descriptions of features or aspects within each embodiment should typically be considered as available for other similar features or aspects in other embodiments.

What is claimed is:

1. An oscillator, comprising:
a base free layer having a variable magnetization direction;
a plurality of oscillation units on the base free layer;

a current source commonly connected to a plurality of regions of the base free layer, which correspond to the plurality of the oscillation units, respectively;
a capacitor connected to a wiring that connects the current source and the base free layer; and
a spectrum analyzer connected to the capacitor,
wherein the oscillation units each include,
a free layer element contacting a first surface of the base free layer and having a width less than a width of the base free layer,
a pinned layer element separated from the free layer element and having a fixed magnetization direction, and
separation layer element between the free layer element and the pinned layer element,
wherein the first surface of the base free layer has a width greater than the width of the free layer element so that a portion of the first surface of the base free layer around the free layer element is not covered by the free layer element.

2. The oscillator of claim 1, wherein the separation layer element includes an insulating material.

3. The oscillator of claim 1, wherein the base free layer, the free layer element, and the pinned layer element have an in-plane magnetic anisotropy.

4. The oscillator of claim 1, wherein the base free layer and the free layer element have a perpendicular magnetic anisotropy, and the pinned layer element has an in-plane magnetic anisotropy.

5. The oscillator of claim 1, wherein the free layer element has a thickness equal to or greater than about 0.5 nm.

6. The oscillator of claim 1, wherein the at least one oscillation unit is on an upper surface of the base free layer.

7. The oscillator of claim 1, wherein the at least one oscillation unit is on a lower surface of the base free layer.

8. The oscillator of claim 1, wherein the oscillator is configured to generate a signal by using precession of a magnetic moment of the free layer element, and
the precession is induced by a spin torque applied to the free layer element from the pinned layer element and a stray field applied from the pinned layer element to the free layer element.

9. An oscillator, comprising:
a base free layer having a variable magnetization direction;
a plurality of oscillation units on the base free layer;
wherein the oscillation units each include,
a free layer element contacting a first surface of the base free layer and having a width less than a width of the base free layer,
a pinned layer element separated from the free layer element and having a fixed magnetization direction, and
a separation layer element between the free layer element and the pinned layer element,
wherein the first surface of the base free layer has a width greater than the width of the free layer element so that a portion of the first surface of the base free layer around the free layer element is not covered by the free layer element;
a first current source connected to a first region of the base free layer corresponding to a first oscillation unit of the plurality of the oscillation units;
a second current source connected to a second region of the base free layer corresponding to a second oscillation unit of the plurality of the oscillation units;
a first capacitor connected between the first current source and the first region;
a second capacitor connected between the second current source and the second region;
a signal combiner to which the first capacitor and the second capacitor are commonly connected; and
a spectrum analyzer connected to the signal combiner.

10. A method of operating an oscillator including a base free layer having a variable magnetization direction, a plurality of oscillation units on the base free layer, a current source commonly connected to a plurality of regions of the base free layer, which correspond to the plurality of the oscillation units, respectively, a capacitor connected to a wiring that connects the current source and the base free layer, and a spectrum analyzer connected to the capacitor, the at least one oscillation unit including a free layer element contacting a first surface of the base free layer and having a width less than a width of the base free layer, a pinned layer element separated from the free layer element and having a fixed magnetization direction, and a separation layer element between the free layer element and the pinned layer element, the method comprising:
inducing precession of a magnetic moment of the free layer element of the oscillation unit; and
detecting variation of a resistance of the oscillator due to the precession,
wherein the first surface of the base free layer has a width greater than the width of the free layer element so that a portion of the first surface of the base free layer around the free layer element is not covered by the free layer element.

11. The method of claim 10, wherein the inducing of the precession includes applying a current between the plurality of oscillation units and the base free layer.

12. The method of claim 11, wherein the current is applied in a direction that causes electrons to flow from the pinned layer element to the free layer element.

13. A method of manufacturing an oscillator, the method comprising:
forming a free layer having a lower portion and an upper portion;
forming a separation layer on an upper surface of the free layer;
forming a pinned layer on an upper surface of the separation layer;
forming a plurality of oscillation units on the lower portion of the free layer by patterning the pinned layer, the separation layer, and the upper portion of the free layer,
wherein an upper surface of the lower portion has a width greater than a width of the at least one oscillation unit so that a portion of the upper surface of the lower portion around the at least one oscillation unit is not covered by the at least one oscillation unit;
forming a current source commonly connected to a plurality of regions of the lower portion of free layer, which correspond to the plurality of the oscillation units, respectively;
forming a capacitor connected to a wiring that connects the current source and the lower portion of the free layer; and
forming a spectrum analyzer connected to the capacitor.

14. The method of claim 13, wherein the separation layer includes an insulating material.

15. The method of claim 13, wherein the free layer and the pinned layer have an in-plane magnetic anisotropy.

16. The method of claim 13, wherein the free layer has a perpendicular magnetic anisotropy, and the pinned layer has an in-plane magnetic anisotropy.

17. The method of claim 13, wherein the upper portion of the free layer has a thickness equal to or greater than about 0.5 nm.

18. A method of manufacturing an oscillator, the method comprising:

forming a plurality of oscillation units having a pinned layer element, a separation layer element, and a free layer element that are sequentially stacked;

forming a base free layer on the plurality of oscillation units;

forming a current source commonly connected to a plurality of regions of the base free layer, which correspond to the plurality of the oscillation units, respectively;

forming a capacitor connected to a wiring that connects the current source and the base free layer; and forming a spectrum analyzer connected to the capacitor, wherein a lower surface of the base free layer has a width greater than a width of the at least one oscillation unit so that a portion of the lower surface of the base free layer around the at least one oscillation unit is not covered by the at least one oscillation unit.

19. The method of claim 18, wherein the separation layer includes an insulating material.

20. The method of claim 18, wherein the base free layer, the free layer element, and the pinned layer element have an in-plane magnetic anisotropy.

21. The method of claim 18, wherein the base free layer and the free layer element have a perpendicular magnetic anisotropy, and the pinned layer has an in-plane magnetic anisotropy.

22. The method of claim 18, wherein the free layer element has a thickness equal to or greater than about 0.5 nm.

* * * * *